United States Patent
Roche

(10) Patent No.: US 6,430,518 B1
(45) Date of Patent: Aug. 6, 2002

(54) METHOD AND APPARATUS FOR MONITORING PERFORMANCE OF MULTIPLE ELECTRICAL LOADS FROM A SINGLE SOURCE

(75) Inventor: Richard M. Roche, Gresham, OR (US)

(73) Assignee: FPS, Inc., Portland, OR (US)

( * ) Notice: Subject to any disclaimer, the term of this patent is extended or adjusted under 35 U.S.C. 154(b) by 0 days.

(21) Appl. No.: 09/372,733

(22) Filed: Aug. 11, 1999

(51) Int. Cl.[7] ............................................. G01R 23/04
(52) U.S. Cl. ......................................... 702/65; 340/663
(58) Field of Search ............................. 702/65, 36, 38, 702/57, 58, 59, 64, 81, 84, 116, 117, 118, 121, 122, 182, 183, 184–185, 188; 340/3.1, 657.9, 660–663; 700/1, 2, 9, 19–22, 26, 27, 109, 110, 108; 714/1, 2, 25, 714, 820, 819, 821

(56) References Cited

U.S. PATENT DOCUMENTS

| 5,519,300 | A | 5/1996 | Leon et al. | 318/729 |
|---|---|---|---|---|
| 5,521,482 | A | 5/1996 | Lang et al. | 318/800 |
| 5,917,428 | A | * 6/1999 | Discenzo et al. | 340/870.01 |
| 5,995,911 | A | * 11/1999 | Hart | 702/64 |
| 6,014,598 | A | * 1/2000 | Duyar et al. | 701/29 |
| 6,262,550 | B1 | * 7/2001 | Kilman et al. | 318/565 |
| 6,308,140 | B1 | * 10/2001 | Dowling et al. | 702/60 |

OTHER PUBLICATIONS

"All–in–one Power Quality Analyzer", Mitchell Instrument Company Catalog #398, pp. 182–184, 1998–1999.

* cited by examiner

Primary Examiner—Marc S. Hoff
Assistant Examiner—Edward Raymond
(74) Attorney, Agent, or Firm—Eugene Stephens & Associates; Thomas B. Ryan

(57) ABSTRACT

A data acquisition system senses current and voltage from a common electrical circuit supplying a power to load branch circuits containing loads that undergo changes in load condition, such as starting and stopping. Transmitters connected to the load branch circuits identify the loads that undergo load condition changes. A data processor receives information from both the sensors and the transmitters to link the sensed current and voltage information from the common electrical circuit to the particular loads that undergo changes in load condition.

64 Claims, 6 Drawing Sheets

METHOD AND APPARATUS FOR MONITORING PERFORMANCE OF MULTIPLE ELECTRICAL LOADS FROM A SINGLE SOURCE

TECHNICAL FIELD

Degenerative electrical and electromechanical failures can be foretold by performance variations of individual electrically driven loads, particularly during start-up. Systems for monitoring such performance variations gather and analyze electrical data to detect potential electrical and electromechanical problems before the occurrence of more significant failures.

BACKGROUND

Both electrical and electromechanical problems, particularly those related to electric motors and their drive circuitry, often develop gradually and can be detected well in advance of outright failure. For example, connection points can loosen, contacts can become pitted or burned, and bearings or other moving parts can wear or partially break. These problems can be detected before they become serious enough to cause permanent damage, system shutdowns, or other significant forms of failure.

Some instruments for detecting electrical and mechanical problems require the motors to be analyzed off-line to exercise more systematic control over the motors and to exclude other electrical influences. Other instruments allow the motors to be continuously monitored on-line, but these are generally mounted with the motors and add considerable cost. Portable instruments, such as infrared detectors and power analyzers, can be used to take periodic readings of motor and drive circuit efficiencies but are time-consuming to set up and operate.

An on-line diagnostic system for analyzing the performance of a polyphase motor is described in U.S. Pat. No. 5,519,300 to Leon et al. Demodulated current and voltage measurements are taken from each of three phases to monitor electrical characteristics useful for detecting problems with the motor. These characteristics include total real power, real power per phase, total reactive power, reactive power per phase, total apparent power, apparent power per phase, overall power factor, power factor per phase, electrical impedance per phase, and electrical balance.

Leon et al.'s diagnostic system can be used for one-time analysis or for historical trending by monitoring the motor at different times. However, the expense of this system, which requires sensors, signal conditioners, analog-to-digital converters, and a computer, can be too great for the limited purpose of monitoring a single motor. Moving the system to individually monitor more than one motor would be time-consuming and would interfere with the accumulation of trending information.

SUMMARY OF INVENTION

My system, which I refer to as an OMNI-BUSS™ system, monitors a plurality of electrical loads, particularly drive motors, from within a common electrical supply circuit. The electrical loads can be monitored from one location with a single array of sensors. Trending information can be accumulated for all of the loads to note changes or patterns associated with deteriorating electrical or electromechanical conditions.

One version of my preferred system senses electrical characteristics of a common electrical circuit that supplies a number of different electrical loads. When the electrical loads undergo a change in load condition, such as during start-up or during a significant change in speed, information is transmitted concerning the identities of the electrical loads. The transmitted information links the sensed electrical characteristics of the common electrical circuit with the individual electrical loads. Performance variations of the electrical loads are monitored by noting changes in the sensed electrical characteristics of the common electrical circuit.

The electrical characteristics (e.g., current and voltage) of the common electrical circuit are preferably stored, and limited intervals of the stored characteristics are linked with the individual electrical loads. The stored intervals preferably include electrical characteristics measured both just prior to and during the changes in load condition. The electrical characteristics stored just prior to the changes in load condition provide a background reference or baseline against which the electrical characteristics accompanying the changes in load condition can be measured.

The load-identifying transmissions can be broadcast through the air or conveyed through a data bus or the electrical circuit itself to a central receiving site. The changes in load condition that trigger the load-identifying transmissions can be detected from sites connected to branch load circuits containing the electrical loads. Only a minimum of sensing is required in the branch load circuits to identify the changes in load condition. Start-ups, for example, are detected by the onset of current flows in branch load circuits.

The sensing of the common electrical circuit preferably includes sensing both current and voltage values in each phase of multi-phase electrical systems. This information can be processed to determine other electrical characteristics such as apparent power, real power, and power factor for each phase. Comparisons can be made between phases and between stored intervals associated with the same loads to detect abnormalities or progressive changes indicative of electrical or electromechanical problems in the branch load circuits.

A data acquisition system for practicing my invention preferably includes sensors that measure electrical characteristics of the common electrical circuit. Transmitters operatively coupled to the branch load circuits emit signals identifying electrical loads as they undergo changes in load condition. A data processor receives information (a) from the sensors monitoring electrical characteristics of the common electrical circuit and (b) from the transmitters monitoring changes in load condition. The data processor associates limited intervals of the sensed electrical characteristics with the electrical loads that undergo changes in load condition within the intervals.

Preferably, a recorder within the data processor continuously stores the sensed electrical characteristics. For example, a circular buffer can be used to temporarily store the sensed electrical characteristics. Stored intervals recorded just prior to and during the changes in load condition can be written to a more permanent data storage file for each load. Conventional algorithms can be used to analyze this data for trends or for more immediate indications of electrical or electromechanical problems. The analysis can be performed contemporaneous with the data acquisition or on a deferred schedule.

The sensors within the common electrical circuit can be further arranged to distinguish between the contributions of multiple power sources. For example, current outputs from a pair of generators can be compared each time a change in load condition triggers the further processing of information from the sensors. Similar to the analysis applied to the individual loads, information concerning the performance of the generators or other power sources can be evaluated to note deteriorating or out-of-tolerance conditions. Similar information can also be derived concerning the common electrical circuit itself.

DRAWINGS

DETAILED DESCRIPTION

Figure 1:
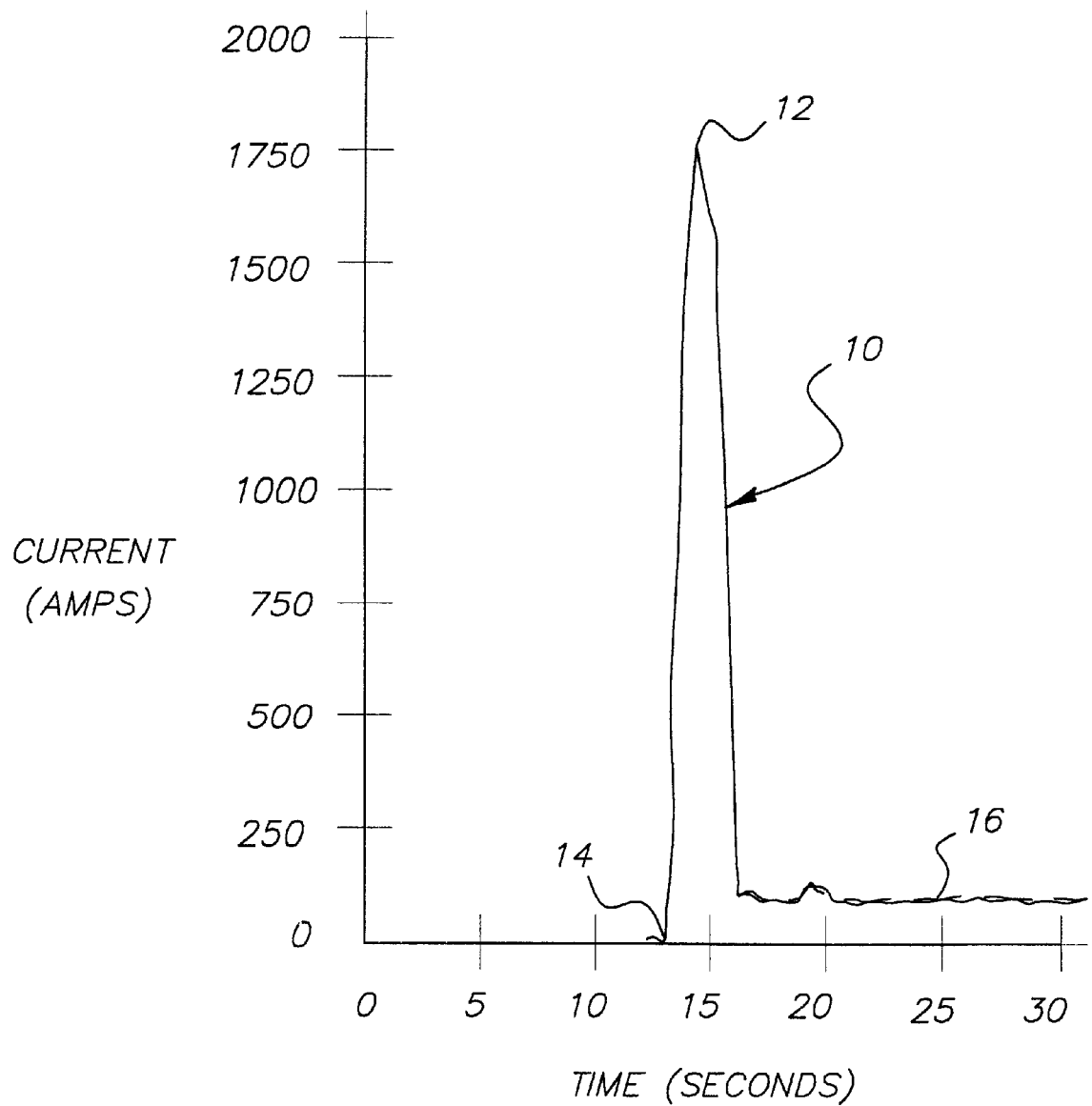
FIG. 1 is a graph plotting amps drawn to elapsed time in a patterned signature typical of inductive motor starts.

Changes is load condition, such as start-ups or significant speed changes of induction motors, are generally accompanied by an instantaneous inrush of current called a "magnetizing" or "reactive" current, which is several times greater than the loads' full rated current. FIG. 1 depicts a typical motor current signature 10 during start-up, expressed as a range of amps drawn over a short time domain in seconds. A peak current flow 12 occurs almost immediately following a completion 14 of the load circuit. A running current 16 is less by a factor of almost 20. The power embodied in the peak current flow 12 is almost all just "apparent" power and represents little actual work.

Apparent power can be expressed in units of kilovolt-amps (kVA) representing the product of volts times amps divided by 1000. Real power can be expressed in units of kilowatts (kW) representing the product of volts times amps times power factor divided by 1000. The power factor, which ranges between 0 and 1, is calculated as a cosine of a phase angle difference between voltage and current sine waves. If the voltage and current sine waves are in phase with each other, the power factor is at unity and 100% of the apparent power does work or is expended as energy such as heat. If the current sine wave lags behind the voltage sine wave, the power consumption is less complete. A typical power factor for a fully loaded electric induction motor is between 0.85 to 0.89. At start-up, however, the power factor may be as low as 0.1.

At the instant (i.e., first second) an induction motor is started, almost all of the power directed to the motor windings is merely apparent power (kVA). Any real power (kW) is mostly attributable to power dissipation losses through electrical conductors between the power source and the motor windings as well as within the motor windings themselves. During a satisfactory motor start, these power losses (kW) are typically low and equally balanced between phases of polyphase motors.

Load circuits of electrical systems typically contain many connections on route from a main supply bus such as circuit breakers, feed cabling, connection lugs, disconnect switches, and contactors. Any one of these can become loosened or develop a poor connection. Contacts, for example, can become pitted or burned. Any such points of resistance draw real power, which dissipates as heat. Start-ups and other changes in load condition in which current flow does not immediately produce actual work provide opportunities for monitoring circuit resistance by measuring the real power consumed ($I^2R$ watts) before work is actually accomplished by the electrical load. The consumption of real power or the power factor on which the real power is based can be ascertained from current and voltage measurements to detect increased resistance in the load circuits before significant damage or other failures occur.

Figure 2:
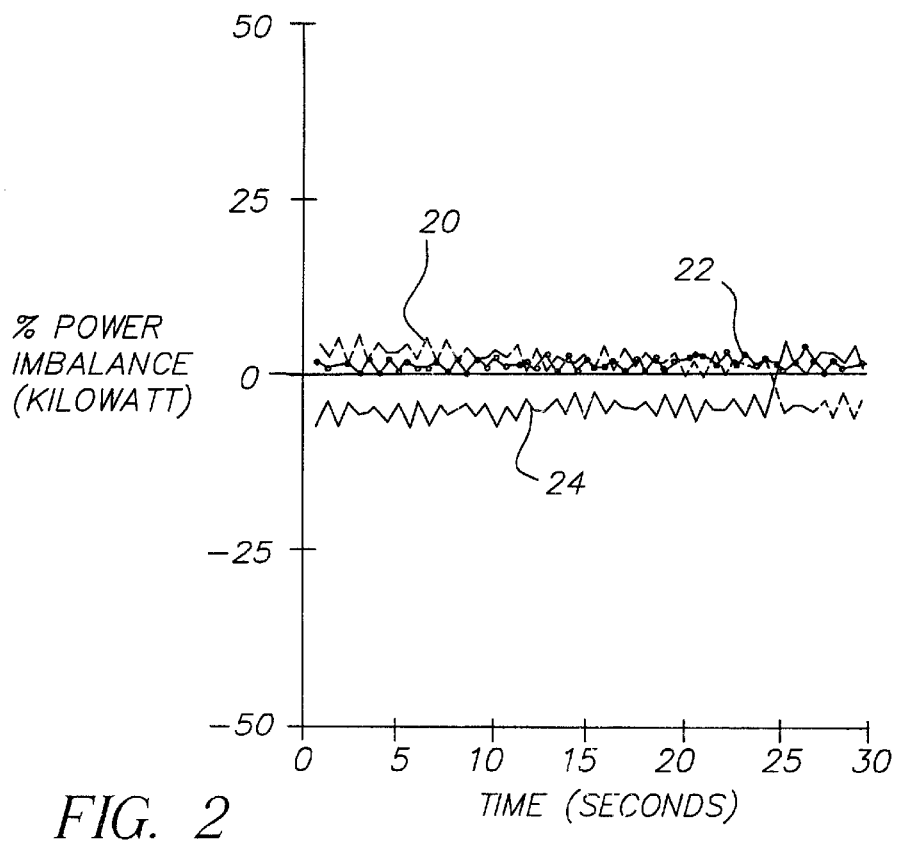
FIG. 2 is a graph plotting percent power imbalance between three phases during a satisfactory motor start.
Figure 3:
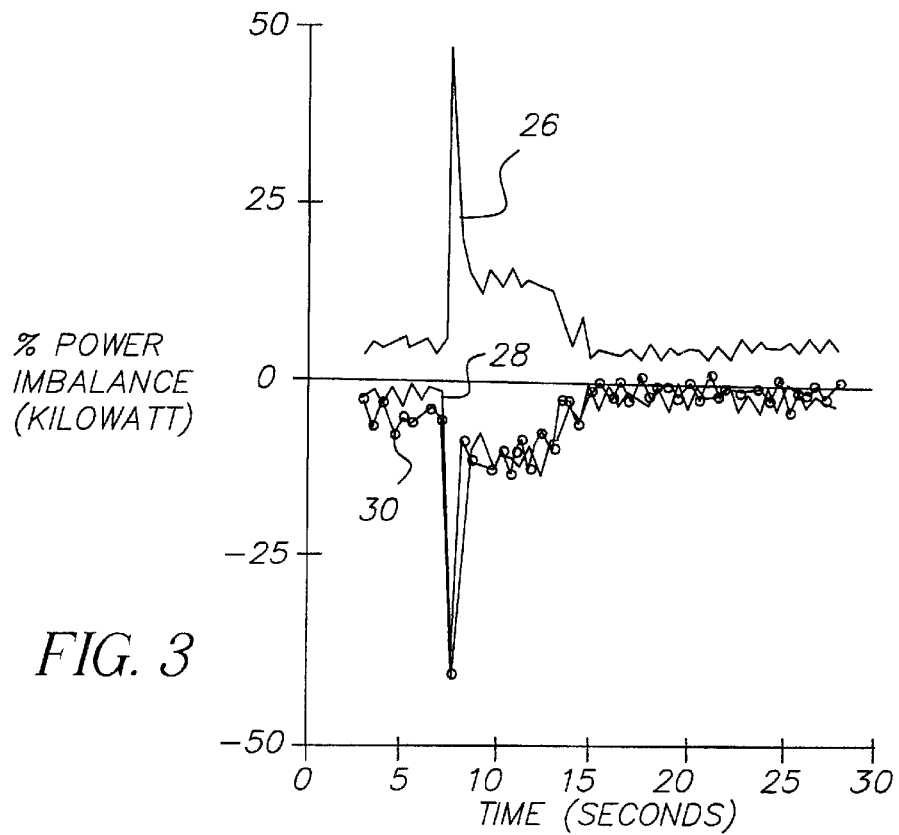
FIG. 3 is a graph plotting percent power imbalance between three phases during an unsatisfactory motor start.

Most electrical motors used in industrial applications are AC three phase induction motors. Any one phase that has more resistance than any other will draw more real power during start-ups and other similar changes in load condition. These measurements can be plotted as a percent of real power imbalance as shown in FIGS. 2 and 3. The imbalances are calculated by comparing the real power in each phase to the average power in all three phases.

A satisfactory starting signature for all three phases 20, 22, and 24 supplying a common load is depicted in FIG. 2. No one phase departs significantly from the other phases throughout the measured time domain. FIG. 3, however, depicts an unsatisfactory starting signature for three phases 26, 28, and 30 of another circuit supplying a common load. A bad connection in the phase 26 produces a significant departure in the expenditure of real power with respect to the other two phases 28 and 30 during a brief period of start-up.

Figure 4:
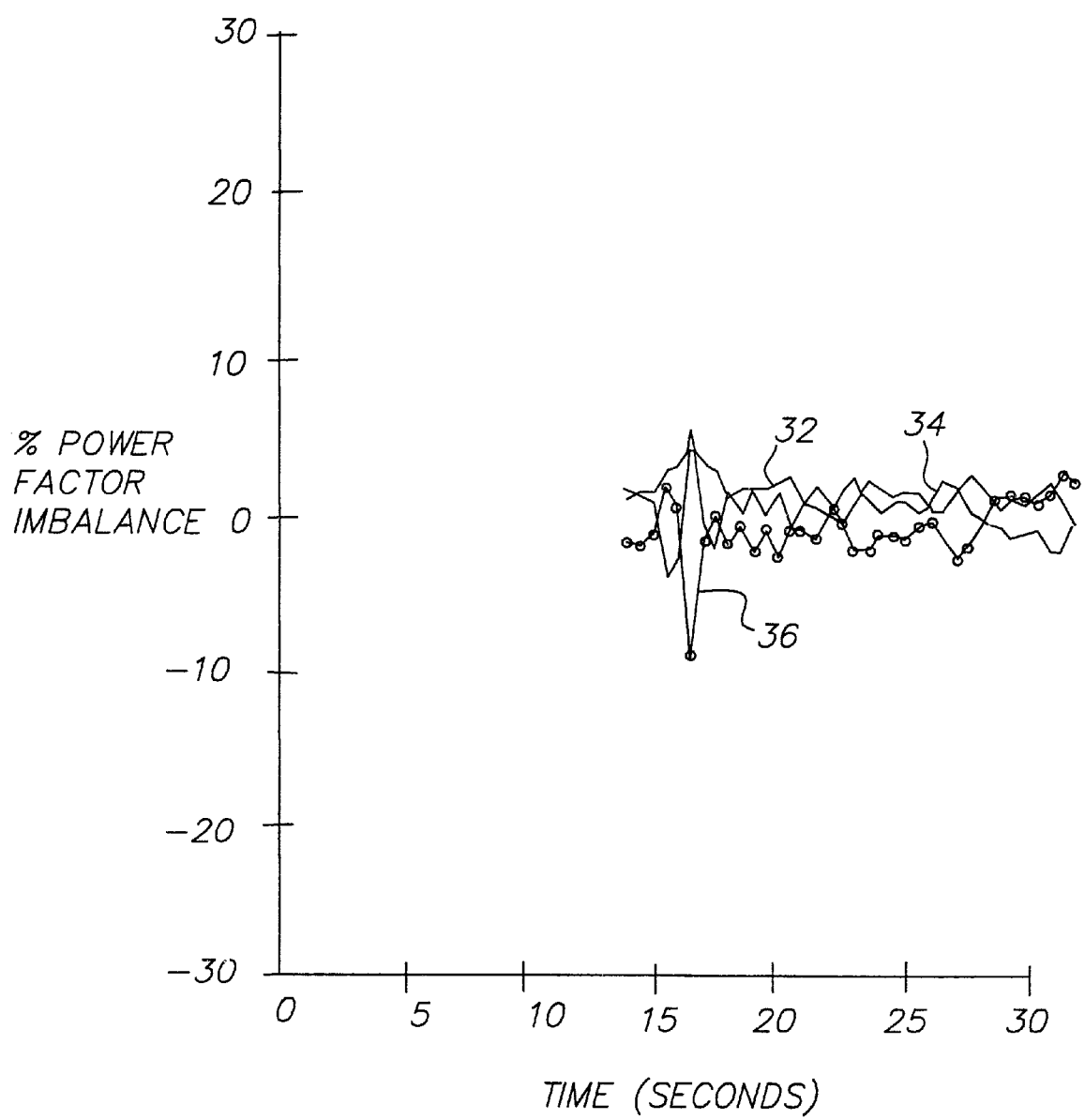
FIG. 4 is a graph plotting percent power factor imbalance between three phases during a motor start that suggests a possible problem in an early stage of development.

Similar information can be obtained by plotting a percent power factor imbalance as shown in FIG. 4. Like the percent kilowatt imbalance, the percent power factor imbalance is sensitive only to differences between the three phases 32, 34, and 36 and not to whether the average power factor changes over the considered time domain. Some imbalance within 10 percent of the average power factor is apparent during a start-up period plotted in FIG. 4. Further attention to this imbalance may be required, especially if the imbalance increases with successive starts of the same load.

Figure 5:
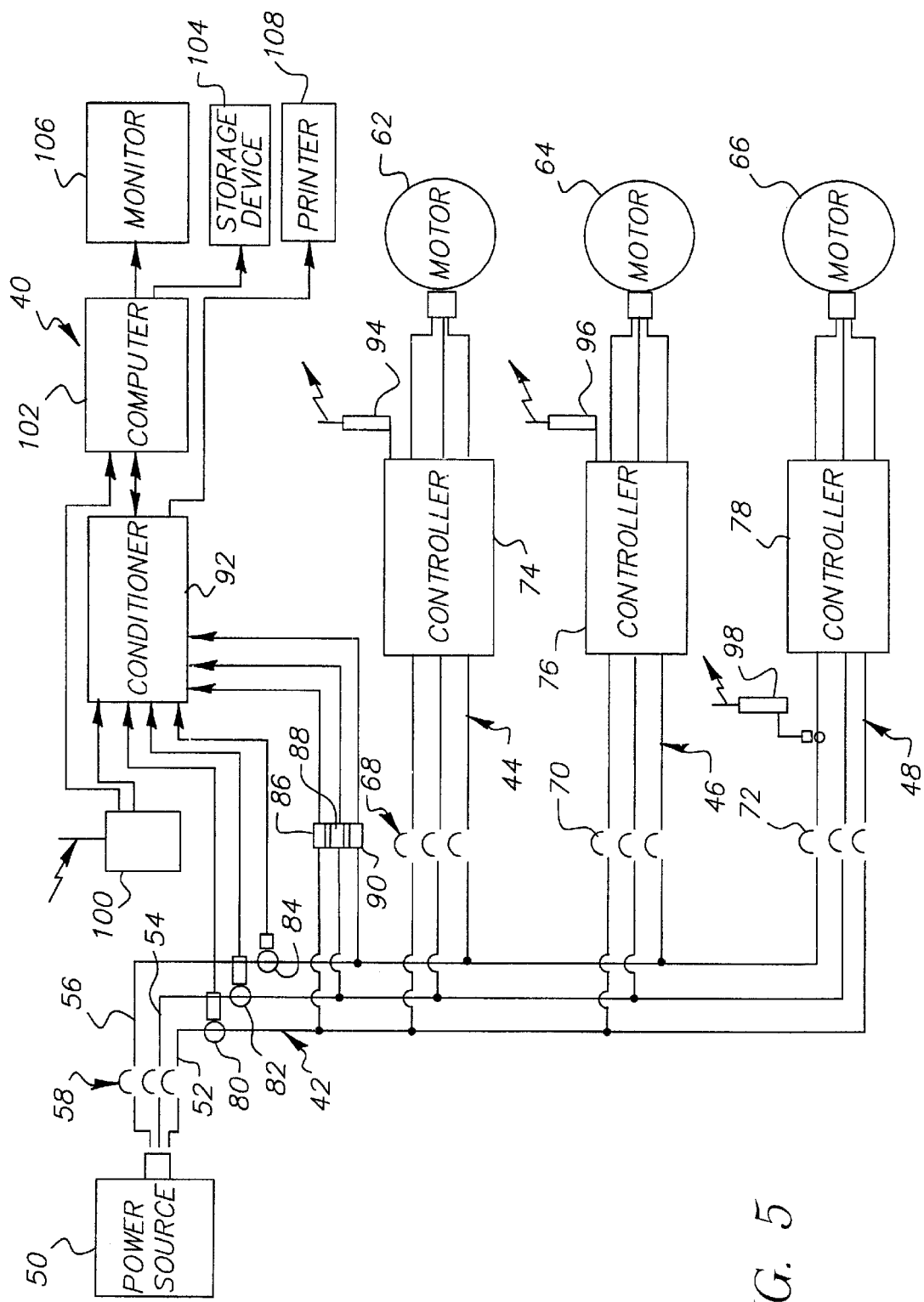
FIG. 5 is an electrical diagram of my data acquisition system for monitoring the performance of three different loads from a common bus.

A preferred embodiment of my data acquisition system 40 is shown in FIG. 5. The opportunity for monitoring the resistance of load circuits during start-up or similar changes in load condition to detect potential problems is exploited across a three phase electrical system having common electrical circuit 42 supplying multiple branch load circuits 44, 46, and 48.

A power source 50, which can range from a local generator to a public utility, supplies each of three phases 52, 54, and 56 of the common electrical circuit 42 through an array of circuit breakers 58. The multiple branch load circuits (also referred to as "load branches") 44, 46, and 48 connect to the common portion of the electrical circuit 42 through a bus bar, switchboard, or other power distributor (not specifically shown) for supplying power to separate electrical loads in the form of induction motors 62, 64, and 66. Circuit breaker arrays 68, 70, and 72 protect each of the load branches 44, 46, and 48; and controllers 74, 76, and 78 regulate the operation of the induction motors 62, 64, and 66.

Sensors for my data acquisition system 40 include three current transformers 80, 82, and 84 and three voltage attenuators 86, 88, and 90 for measuring current and voltage in each of the three phases 52, 54, and 56 within the common electrical circuit 42. The voltage and current information is fed to a signal conditioner 92, which includes an analog-to-digital converter and a circular buffer for continuously storing information from the current transformers 80, 82, and 84 and the voltage attenuators 86, 88, and 90. Sampling rates can vary depending on the number of data points required for subsequent analysis, but a sampling rate between 500 hertz and 1000 hertz is believed sufficient for most measurements.

Within each of the load branches 44, 46, and 48 is a radio frequency transmitter 94, 96, and 98 that broadcasts a unique identification code when the induction motor 62, 64, or 66 in the same load branch 44, 46, or 48 undergoes a change in load condition, such as starting, stopping, or changing speed. The information is received by a single radio receiver 100 connected to the conditioner 92. The transmitters 94, 96, and 98 are preferably spread spectrum (e.g., 900–928 MHz) broadcasters emitting redundant messages to improve reliability. One or more repeaters (not shown) can be used to extend the range of the transmitters 94, 96, and 98.

The transmitters 94 and 96 are connected to the motor controllers 74 and 76 to trigger broadcasts upon detection of any changes in load condition. The transmitter 98 is located in advance of the controller 78 and includes a current flow sensor 102 to detect similar changes in load condition. As at least partially exemplified by the two different locations of the transmitters 94, 96, and 98, similar transmitters could be located along the load branches 44, 46, and 48 anywhere the changes in load condition can be detected. Also, more than one transmitter could be located within each of the load branches 44, 46, and 48 to distinguish among load conditions, such as between high and low ranges of operation.

Although the transmitters 94, 96, and 98 are preferably radio frequency transmitters, other types of transmitters could also be used including encoders that transmit signals through the load branches 44, 46, and 48 and common electrical circuit 42 to a decoder that would replace the radio receiver 100. Separate hard wiring or a common digital bus between the load branches 44, 46, and 48 and the signal conditioner 92 or other common portion of the data acquisition system 40 could also be used, but are regarded as much more cumbersome.

A programmable computer 102 communicates with the signal conditioner 92 and the receiver 100 to further process, organize, store, and display information gathered from the sensors 80, 82, 84, 86, 88, and 90 connected to the common electrical circuit 42 and from the transmitters 94, 96, and 98 connected to the load branches 44, 46, and 48. The data from the sensors 80, 82, 84, 86, 88, and 90 is temporarily stored in the circular buffer—a type of recorder in which the oldest data is overwritten by the most recent data. Under control of computer software, receipt of a transmission identifying a change in load condition of one of the motors 62, 64, or 66 initiates a command sequence that accesses the circular buffer, extracts a predetermined interval of stored data, and writes this data to a storage device 104 such as a hard disk or other storage medium. A sensed threshold value associated with changes in load condition, such as a high current value, could also be used to initiate a command sequence in which information from the circular buffer is similarly combined with information from the receiver 100.

The motor identifying information reaching the receiver 100 links the stored data intervals extracted from the circular buffer to the motors 62, 64, or 66 that undergo changes in load condition within the intervals. The stored data intervals extracted from the circular buffer preferably include time frames before, during, and after the triggering load condition changing event. Exemplary time frames are 3 seconds of baseline data before the event, 1 or more seconds to capture data on the event itself, and 20 additional seconds of post event data to observe normal running conditions. The duration of the extracted data intervals can be dynamically varied to capture relevant information concerning the load event without saving unnecessary information acquired after steady state conditions are restored. For example, average current draw can be monitored, and the stored intervals can be foreshortened following the detection of a flattening of a rate of change in the current draw.

Preferably, a separate write file is created for each of the motors 62, 64, and 66 to preserve the data for trend analysis and archival information. Contemporaneous data presentations can be made by displaying information such as motor ID number, signature plots, and data tables on a monitor 106 or by sending similar information to a printer 108. Immediate warnings of possible electrical problems can also be issued for current or power factor imbalances exceeding threshold values or for other out-of-tolerance measurements.

Further analysis including additional data presentations can be performed in real time by software modules of the computer 102 or on a delayed schedule by accessing the data files of the storage device 104. Within the stored intervals, measured values immediately preceding the change in load condition provide a reference or baseline against which the subsequently measured values can be assessed. In other words, the baseline values are subtracted from the values measured during the changes in load condition, and the differences are attributed to the changes in load condition. In this way, the conditions of the load branches 44, 46, and 48 can be individually assessed from current and voltage measurements taken from the common electrical circuit 42—a methodology I refer to as "bus deductive measurement."

Once the information from the load branches 44, 46, and 48 is so isolated and identified, conventional algorithms can be employed to further analyze the information similar to analyses currently performed for single induction motor circuits. Both electrical and electromechanical problems can be identified in this way, often before the problems are severe enough to cause significant damage or to force an inopportune shutdown. The disclosure of U.S. Pat. No. 5,519,300 to Leon et al. is hereby incorporated by reference as such an example. The hardware for practicing my invention is also widely available including the conditioner 92, which can be specified as a multi-channel A/D converter with the ability to process pre- and post-trigger events.

At times, load condition changes in more than one of the load branches 44, 46, and 48 can occur within the same limited time span. For example, the stored intervals of more than one load condition change can overlap, complicating the attribution of the recorded changes in electrical characteristics to the responsible load branch. The resulting data associated with coincidentally overlapping (random) events can be discarded, or a further analysis can be performed such as by more finely discriminating between the time domains of the two events. Regular (systematic) events between multiple load branches can be similarly monitored or evaluated as a single event for the combined load condition change.

The transmitters 94, 96, and 98 can be limited to just the load branches 44, 46, and 48 that merit particular attention, such as those that perform important functions or are costly to repair. The sensors 80, 82, 84, 86, 88, and 90 can be located anywhere along the common electrical circuit 42 up to the power source 50. In fact, the sensors 80, 82, 84, 86, 88, and 90 can also be used to monitor conditions of both the common electrical circuit 42 and the power source 50.

Figure 6:
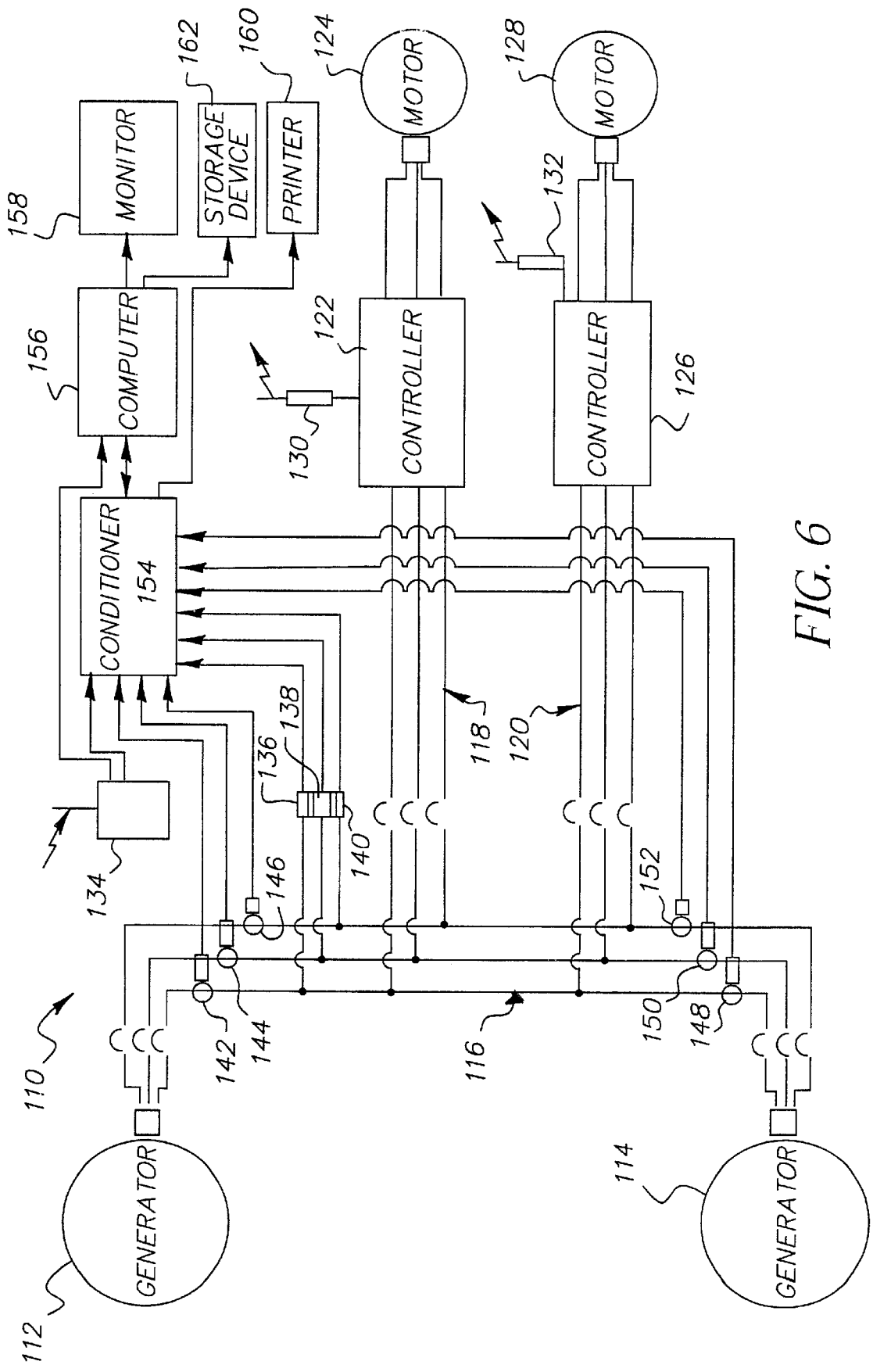
FIG. 6 is an electrical diagram of another configuration of my data acquisition system for monitoring the performance of two different loads from a common bus supplied by two different generators.

Another data acquisition system 110 arranged in accordance with my invention is shown in FIG. 6. Two generators 112 and 114 supply power to a common three-phase electrical circuit 116. The power is consumed by two load branches 118 and 120. A motor controller 122 along the load branch 118 regulates power to a motor 124, and a motor controller 126 along the load branch 120 regulates power to a motor 128. Transmitters 130 and 132 associated with the controllers 122 and 126 broadcast motor identifying information to a receiver 134 in response to changes is load condition within the load branches 118 and 120.

Three voltage attenuators 136, 138, and 140 measure voltage in each phase of the common electrical circuit 116. A first set of three current transformers 142, 144, and 146 measures the current output of the generator 112, and a second set of three current transformers 148, 150, and 152 measures the current output of the generator 114. A signal conditioner 154 receives the sensed information from the three voltage attenuators 136, 138, and 140 and the two sets of three current transformers 142, 144, 146 and 148, 150, 152.

For purposes of monitoring the condition and performance of the load branches 118 and 120, the measured currents from the two sets of current transformers 142, 144, 146 and 148, 150, 152 are summed according to their phase. A programmable computer 156 interacts with the receiver 134 and the signal conditioner 154 to perform functions of processing, organizing, storing, and displaying information similar to the preceding embodiment. Contemporaneous or later accessed information can be displayed on a monitor 158 or output from a printer 160. A data storage device 162 can be used to store the acquired data according to the associated motor 124 or 128 for future analysis.

The two sets of current transformers 142, 144, 146 and 148, 150, 152 also provide for distinguishing between the performances of the two generators 112 and 114. Information concerning the individual performances of the generators 112 and 114, as well as the performance of the rest of the common electrical circuit 116 is obtained each time a change in load condition triggers the recording of information from the current and voltage sensors. For example, load sharing stability and reactive current flows can be monitored to detect imbalances between the generators 112 and 114. Other factors related to potential problems including speed droop measurements and governor/load responses can also be monitored.

Figure 7:
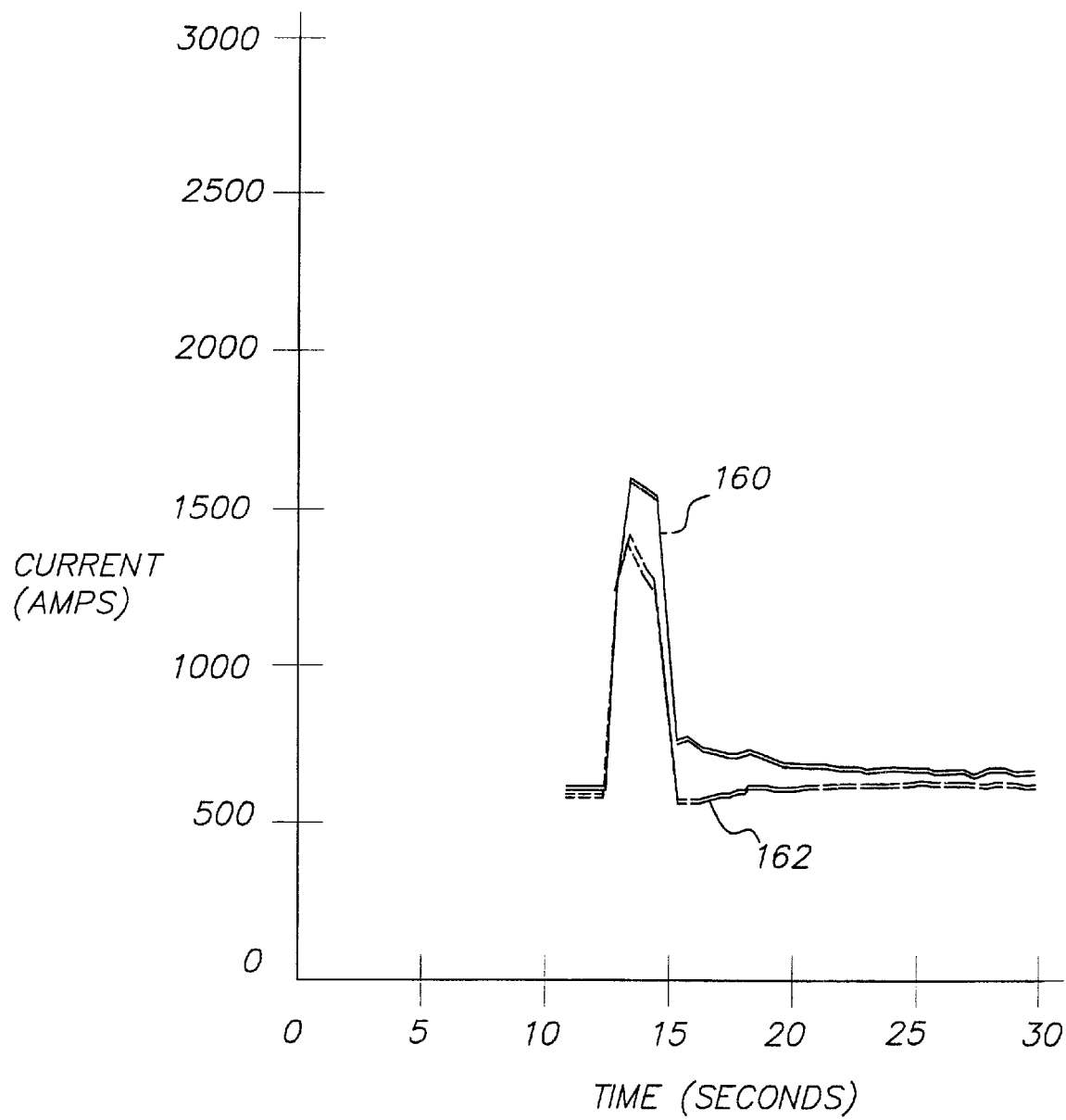
FIG. 7 is a graph plotting the current outputs of two generators arranged in parallel for supplying a common electrical circuit.

A graph comparing current outputs 160 and 162 of the two generators 112 and 114 during a load condition change of one of the motors 124 or 128 is shown in FIG. 7. Significantly more peak current is supplied by the generator 112 than the generator 114. The steady state operating current of the generator 112 is also a little more. While these differences may be within system tolerances, any worsening suggests a problem with one of generators 112 or 114 or with coordination between the generators 112 and 114.

In addition to diagnosing potential problems, starting and stopping conditions can be used to monitor load demands and usage patterns of the individual electrical loads and the power sources for supporting system design improvements and for scheduling routine maintenance. Archival information is also available to investigate other electrical or electromechanical problems as they might later be defined or to provide information on more sudden failures or other malfunctions involving system operation.

I claim:

1. A method of monitoring performance of a plurality of electrical loads supplied by a common electrical circuit comprising the steps of:

sensing electrical characteristics of the common circuit supplying the plurality of electrical loads from a central location along the common electrical circuit that is remote to at least some of the plurality of electrical loads supplied by the common electrical circuit;

transmitting information identifying individual electrical loads that undergo a change in load condition from individual locations proximate to the individual electrical loads and remote to the central location along the common electrical circuit;

associating the sensed electrical characteristics of the common electrical circuit with the individual electrical loads identified by the transmitted information by combining information sensed from the common electrical circuit at the central location with the information transmitted to the central location from the individual locations proximate to the individual electrical loads; and monitoring performance of a plurality of the individual electrical loads from the sensed electrical characteristics of the common electrical circuit.

2. The method of claim 1 in which said step of associating includes linking time domains of the sensed electrical characteristics of the common electrical circuit at the central location with the individual electrical loads that undergo the change in load condition.

3. The method of claim 1 including the further step of recording the electrical characteristics of the common electrical circuit.

4. The method of claim 3 in which said step of associating includes linking intervals of the recorded electrical characteristics to the individual electrical loads.

5. The method of claim 4 in which said step of monitoring includes comparing one of the recorded intervals with other recorded intervals associated with the same electrical load.

6. The method of claim 4 in which the recorded intervals linked to the individual electrical loads include electrical characteristics recorded in advance of the step of transmitting information identifying the individual electrical loads so that the electrical characteristics both be fore and during the change in load condition are recorded within the intervals.

7. The method of claim 5 in which the step of recording includes continuously storing the electrical characteristics within a circular buffer.

8. The method of claim 4 in which said step of sensing includes sensing a plurality of electrical phases for both current and voltage.

9. The method of claim 8 in which the step of monitoring includes measuring a power factor imbalance among the phases during the recorded intervals.

10. The method of claim 8 in which the step of monitoring includes measuring a real power imbalance among the phases during the recorded intervals.

11. The method of claim 10 in which the step of monitoring includes comparing the imbalance among phases between one recorded interval and the other recorded intervals associated with the same electrical load.

12. The method of claim 1 in which the individual electrical loads are located within individual branch load circuits supplied by the common electrical circuit, and the step of transmitting includes transmitting the information identifying individual electrical loads from transmitters connected to the branch load circuits to a common receiver without broadcasting information concerning the performance of the identified electrical loads to the common receiver.

13. The method of claim 12 in which the step of transmitting includes broadcasting the load-identifying information through air to the common receiver.

14. The method of claim 12 in which the step of transmitting includes encoding the load-identifying information for transmission through the individual branch load circuits and the common electrical circuit to the common receiver.

15. The method of claim 14 including the further step of decoding the load-identifying information at the common receiver.

16. The method of claim 1 in which the step of transmitting initiates the step of associating by starting a command sequence that links the individual electrical loads identified in the transmissions with time domains of the sensed electrical characteristics.

17. The method of claim 1 including the further step of warning of an electrical deficiency within a portion of the circuit containing one of the individual electrical loads.

18. The method of claim 1 in which the step of sensing includes sensing electrical characteristics of more than one source of power to the common electrical circuit.

19. The method of claim 18 in which the step of monitoring includes monitoring performance of the individual sources of power from the sensed electrical characteristics of the common electrical circuit.

20. The method of claim 19 in which the step of sensing also includes separately sensing current flows from the individual sources of power.

21. A method of monitoring performance of a plurality of electrical loads supplied by a common electrical circuit comprising the steps of:
   sensing electrical characteristics of the common electrical circuit supplying the plurality of electrical loads;
   transmitting information identifying individual electrical loads that undergo a change in load condition;
   associating the sensed electrical characteristics of the common electrical circuit with the individual electrical loads identified by the transmitted information;
   monitoring performance of the individual electrical loads from the sensed electrical characteristics of the common electrical circuit;
   the step of sensing including sensing electrical characteristics of more than one source of power to the common electrical circuit;
   the step of monitoring including monitoring performance of the individual sources of power from the sensed electrical characteristics of the common electrical circuit;
   the step of sensing including separately sensing current flows from the individual sources of power; and
   the step of associating including combining information from the separately sensed current flows.

22. A data acquisition system for monitoring conditions within branch load circuits supplied by a common electrical circuit comprising:
   sensors that measure electrical characteristics of the common electrical circuit supplying the branch load circuits;
   the sensors being located along the common electrical circuit in positions at which the electrical characteristics of the common electrical circuit reflect performance characteristics of the electrical loads located within the branch load circuits supplied by the common electrical circuit;
   transmitters that are associated with the branch load circuits and that emit signals identifying electrical loads within the branch load circuits undergoing a change in load condition;
   the transmitters being located proximate to the branch load circuits and remote to the sensors located along the common electrical circuit; and
   a data processor that:
      receives information (a) from the sensors relating to the electrical characteristics of the common electrical circuit and (b) from the transmitters relating to the electrical loads undergoing changes in load condition, and
      associates intervals of the sensed electrical characteristics with the electrical loads that undergo changes in load condition within the intervals.

23. The system of claim 22 in which the data processor includes a recorder that stores the intervals of the sensed electrical characteristics.

24. The system of claim 23 in which the stored intervals include sensed electrical characteristics recorded in advance of the changes in load condition to provide a baseline for comparing the effects of the changes in load condition.

25. The system of claim 24 in which the recorder includes a circular buffer for temporarily storing the sensed electrical characteristics in advance of the changes in load condition.

26. The system of claim 22 in which the transmitters broadcast the signals identifying the electrical loads undergoing changes in load condition.

27. The system of claim 26 in which the data processor includes a receiver that receives the broadcast of signals from a plurality of different transmitters.

28. The system of claim 22 in which the transmitters encode the signals identifying the electrical loads for transmission through the branch load and common electrical circuits.

29. The system of claim 28 in which the data processor includes a receiver that decodes signals from a plurality of different branch load circuits.

30. The system of claim 22 in which the common electrical circuit is a multi-phase circuit and the sensors measure both current and voltage of a plurality of phases.

31. The system of claim 30 in which the data processor determines power imbalances among the phases within one of the intervals and compares these imbalances to other intervals of the sensed electrical characteristics associated with the same loads to determine performance variations of individual loads.

32. A data acquisition system for monitoring conditions within branch load circuits supplied by a common electrical circuit comprising:
   sensors that measure electrical characteristics of the common electrical circuit supplying the branch load circuits;
   transmitters that are associated with the branch load circuits and that emit signals identifying electrical loads within the branch load circuits undergoing a change in load condition; and
   a data processor that:
      receives information (a) from the sensors relating to the electrical characteristics of the common electrical circuit and (b) from the transmitters relating to the electrical loads undergoing changes in load condition, and associates intervals of the sensed electrical characteristics with the electrical loads that undergo changes in load condition within the intervals, wherein the sensors include a first array of sensors for measuring the electrical characteristics contributed by a first power source and a second array of sensors for measuring electrical characteristics contributed by a second power source.

33. The system of claim 32 in which the data processor combines the electrical characteristics contributed by the first and second power sources prior to associating the intervals of the sensed electrical characteristics with the electrical loads.

34. A method of monitoring performance of a plurality of electrical loads supplied by a common electrical circuit comprising the steps of:

sampling electrical characteristics of the common electrical circuit in a position along the common electrical circuit at which the electrical characteristics of the common electrical circuit reflect collective performance of the plurality of electrical loads;

identifying individual electrical loads that undergo changes in loading condition independently of the sampled electrical characteristics of the common electrical circuit reflecting the collective performance of the plurality of electrical loads;

linking intervals of the sampled electrical characteristics with the individual electrical loads that undergo changes in loading condition within the intervals; and comparing the sampled electrical characteristics of one interval to sampled electrical characteristics of other intervals associated with the same electrical loads to determine performance variations of individual electrical loads.

35. The method of claim 34 in which said step of sampling includes recording information from a plurality of electrical phases.

36. The method of claim 35 including a further step of evaluating the sampled electrical characteristics to determine performance imbalances between the electrical phases.

37. The method of claim 36 in which said step of comparing includes comparing the performance imbalance of the one interval to performance imbalances of the other intervals to determine the performance variations of the individual electrical loads.

38. The method of claim 34 including a further step of transmitting identifying information about the individual electrical loads that undergo a change in loading condition.

39. The method of claim 38 in which the identifying information is transmitted from a plurality of locations to a common receiver.

40. The method of claim 34 including a further step of storing the intervals of the sampled electrical characteristics associated with the individual electrical loads for storing cumulative information about the individual electrical loads.

41. The method of claim 40 including a further step of displaying identification and trending information for the individual electrical loads.

42. A method of monitoring performance of a plurality of electrical loads supplied by a common electrical circuit comprising the steps of:

sampling electrical characteristics of the common electrical circuit;

identifying individual electrical loads that undergo changes in loading condition;

linking intervals of the sampled electrical characteristics with the individual electrical loads that undergo changes in loading condition within the intervals; and comparing the sampled electrical characteristics of one interval to sampled electrical characteristics of other intervals associated with the same electrical loads to determine performance variations of individual electrical loads, wherein the changes in loading condition include starting the electrical loads in motion.

43. The method of claim 34 in which said step of comparing includes identifying a performance decrease in an electrical circuit to one of the individual electrical loads.

44. The method of claim 43 in which said step of comparing includes identifying a performance decrease in an electrical circuit supplying more than one of the individual electrical loads.

45. A method of monitoring performance of a plurality of electrical loads supplied by a common electrical circuit comprising the steps of:

sampling electrical characteristics of the common electrical circuit;

identifying individual electrical loads that undergo changes in loading condition;

linking intervals of the sampled electrical characteristics with the individual electrical loads that undergo changes in loading condition within the intervals; and comparing the sampled electrical characteristics of one interval to sampled electrical characteristics of other intervals associated with the same electrical loads to determine performance variations of individual electrical loads, wherein the step of sampling includes sampling electrical characteristics contributed by a plurality of power sources for the common electrical circuit.

46. The method of claim 45 including a further step of distinguishing between the electrical characteristics contributed by the plurality of power sources.

47. A method of monitoring performance of a plurality of electrical loads supplied by a common electrical circuit comprising the steps of:

recording electrical characteristics of the common electrical circuit supplying the plurality of different electrical loads;

the electrical characteristics being recorded reflecting the collective performance of the plurality of electrical loads;

sending information concerning the identity of the electrical loads when the loads undergo a change in load condition;

receiving the information concerning the identity of the electrical loads independently of the recorded electrical characteristics; and associating intervals of the recorded electrical characteristics with the individual electrical loads identified by the received information.

48. The method of claim 47 in which the intervals associated with the individual electrical loads include time frames with which the individual electrical loads undergo changes in load condition.

49. A method of monitoring performance of a plurality of electrical loads supplied by a common electrical circuit comprising the steps of:

recording electrical characteristics of the common electrical circuit supplying the plurality of different electrical loads;

sending information concerning the identity of the electrical loads when the loads undergo a change in load condition;

receiving the information concerning the identity of the electrical loads;

associating intervals of the recorded electrical characteristics with the individual electrical loads identified by the received information;

the intervals associated with the individual electrical loads including time frames with which the individual electrical loads undergo changes in load condition; and the intervals also including time frames just before the individual electrical loads undergo changes in load condition.

50. The method of claim 49 including the further step of contrasting electrical characteristics stored in the time frames during the changes in load condition from the electrical characteristics stored in time frames just before the changes in load condition to associate changes in electrical characteristics with the changes in load condition.

51. A method of monitoring performance of a plurality of electrical loads supplied by a common electrical circuit comprising the steps of:

recording electrical characteristics of the common electrical circuit supplying the plurality of different electrical loads;

sending information concerning the identity of the electrical loads when the loads undergo a change in load condition;

receiving the information concerning the identity of the electrical loads;

associating intervals of the recorded electrical characteristics with the individual electrical loads identified by the received information; and the step of receiving initiating the step of associating intervals of the recorded electrical characteristics with the individual electrical loads.

52. The method of claim 47 including further steps of monitoring the recorded electrical characteristics for a threshold condition and initiating the step of associating when the threshold condition is reached.

53. The method of claim 47 in which the step of recording includes separately storing sensed electrical characteristics contributed by a plurality of power sources.

54. The method of claim 53 including the further step of comparing the sensed electrical characteristics contributed by the plurality of power sources to detect changes.

55. A data acquisition system for monitoring conditions in branch load circuits supplied by a common electrical circuit comprising:

first sensors that measure electrical characteristics of the common electrical circuit supplying the branch load circuits;

a recorder that stores the measured electrical characteristics;

second sensors that detect changes in load condition within the branch load circuits; and a processor that (a) extracts intervals of the stored electrical characteristics including time frames recorded both before and during the detected changes in load condition, (b) contrasts the electrical characteristics recorded during the changes in load condition from the electrical characteristics recorded before the changes in load condition, and (c) links the contrasted electrical characteristics with the branch load circuits that undergo changes in load condition within the intervals.

56. The system of claim 55 in which the first sensors measure both current and voltage in the common electrical current and the second sensors detect a flow of current in individual branch load circuits.

57. The system of claim 55 further comprising transmitters that identify the branch load circuits that undergo changes in load condition.

58. The system of claim 57 further comprising a receiver connected to the processor for forwarding information identifying the branch load circuits undergoing load condition changes to the processor.

59. The system of claim 55 in which the processor includes a curricular buffer for continuously storing electrical characteristics of the common electrical circuit.

60. The system of claim 55 further comprising a data storage device that stores the extracted intervals of stored electrical characteristics according to the branch load circuits that undergo changes in load condition within the intervals.

61. The system of claim 55 in which the common electrical and branch load circuits are polyphase electrical circuits and the first sensors measure electrical characteristics in a plurality of phases.

62. The system of claim 61 in which the processor compares the contrasted electrical characteristics between phases to determine relative balances between the phases of the branch load circuits.

63. The system of claim 55 in which the first sensors include separate groups of sensors for separately measuring electrical characteristics of a plurality of power sources supplying the common electrical circuit.

64. The system of claim 63 in which the data processor also compares the separately measured electrical characteristics of the power sources.

* * * * *